United States Patent [19]
Iijima et al.

[11] Patent Number: 5,594,348
[45] Date of Patent: Jan. 14, 1997

[54] SURGE TESTING METHOD IN DECOMPRESSED ATMOSPHERE FOR A SMALL-SIZE ELECTRIC MACHINE AND APPARATUS THEREOF

[75] Inventors: Yasuo Iijima; Masahiro Tsubokawa, both of Takefu, Japan

[73] Assignee: Matsushita Electric Industrial Co., Ltd., Kadoma, Japan

[21] Appl. No.: 450,638

[22] Filed: May 25, 1995

[30]  Foreign Application Priority Data

Jun. 17, 1994 [JP] Japan ................................... 6-135564

[51] Int. Cl.$^6$ ................................................. G01R 31/00
[52] U.S. Cl. ......................... 324/546; 324/523; 324/551; 340/647
[58] Field of Search ................................... 324/522, 523, 324/527, 536, 541, 544, 545, 546, 551, 772, 388; 340/646, 647, 648

[56]  References Cited

U.S. PATENT DOCUMENTS

| | | | |
|---|---|---|---|
| 3,887,866 | 6/1975 | Safer et al. | 324/546 |
| 3,932,806 | 1/1976 | Kawada | 324/546 |

FOREIGN PATENT DOCUMENTS

| | | | |
|---|---|---|---|
| 246472 | 11/1991 | Japan | 324/546 |
| 5-490656 | 7/1993 | Japan . | |

*Primary Examiner*—Kenneth A. Wieder
*Assistant Examiner*—Diep Do
*Attorney, Agent, or Firm*—McDermott, Will & Emery

[57]  ABSTRACT

To carry out a non-destructive test for testing insulation of a small-size electric machine having a coil, a surge voltage is applied to the coil of the electric machine mounted in a decompression tank whose inner pressure is kept from 15 to 25 [Torr] so as to generate glow discharge in case there exists a flaw in the coil.

3 Claims, 7 Drawing Sheets

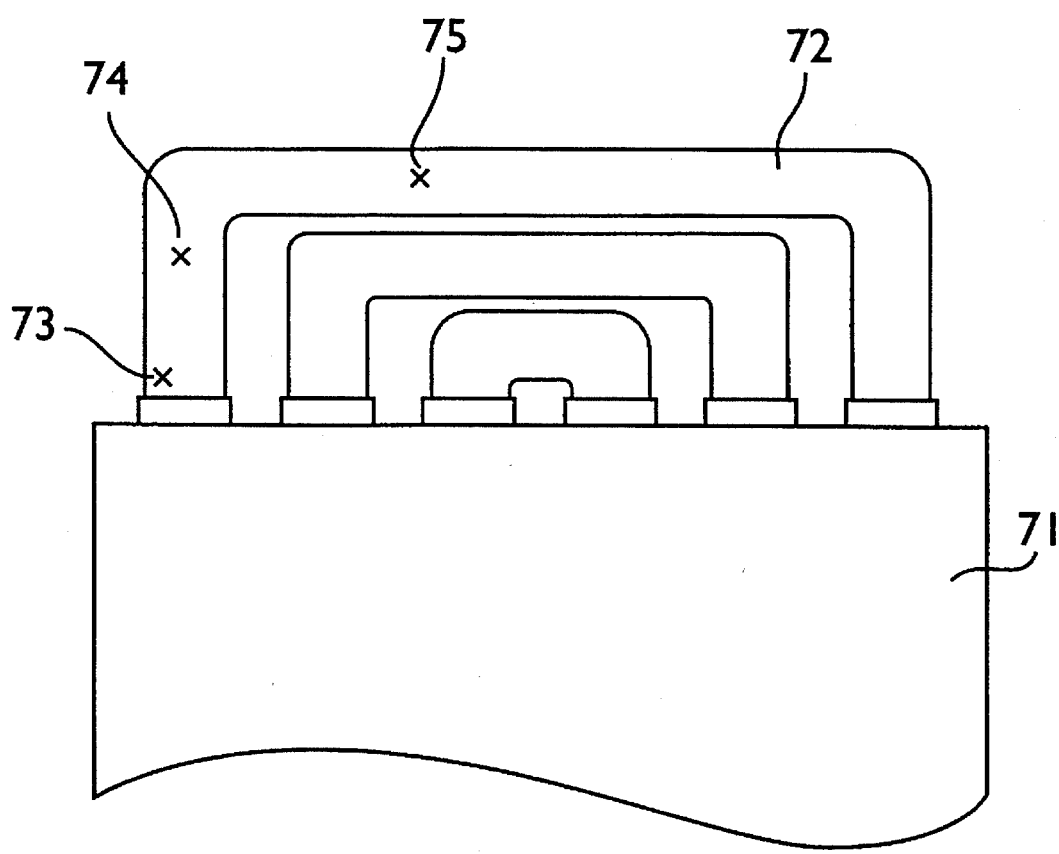

SURGE TESTING METHOD IN DECOMPRESSED ATMOSPHERE FOR A SMALL-SIZE ELECTRIC MACHINE AND APPARATUS THEREOF

FIELD OF THE INVENTION AND RELATED ART STATEMENT

1. Field of the Invention

The present invention relates to a non-destructive insulation testing method and apparatus for high-sensitively detecting a defect of electrical insulation in windings of a small-size electric machine such as a small-size motor.

2. Description of the Related Art

Generally, dielectric breakdown in windings of a small-size motor etc. is caused mainly at a flaw formed in an insulation coating of a magnet wire. This flaw of the wire is typically made by mechanical shock, mechanical pressure or friction which are applied to the magnet wire with some machine or tool during a winding process of the magnet wire or an assembling process of a motor. Through the flaw, a local dielectric breakdown (i.e., layer shortcircuit) generates between adjacent two magnet wires while the motor is being driven. Also, a dielectric breakdown (i.e., earth fault) generates between the wire and a laminated stator core which is disposed proximate to the magnet wire. Once the dielectric breakdown has occurred, an abnormal current such as a short-circuit current flows through the magnet wire. The winding is thus heated rapidly, thereby resulting in burning finally. The motor thus becomes useless.

To detect the above-mentioned flaw of the wire, AC withstand voltage test, insulation resistance test, pin-hole test, surge test, corona discharge test and decompression test have been established conventionally.

Hereafter, methods of the above-mentioned tests will be described. As to the AC withstand voltage test and the insulation resistance test, it is possible to detect a flaw of coil only in case where the flaw of the magnet wire is very large and is in directly contact with or proximate to the laminate core. Accordingly, it is possible to detect earth fault only.

As to the pin-hall test, a test sample is thoroughly dipped in a solution of salt and phenolphthalein. In this test, the flaw of coil can be detected, but the test is a destructive test substantially. Accordingly, the test can not be applied to all products.

According to the surge test, contact of the flaw of coil with the laminate core can be detected. Also, the surge test may be applied to the layer shortcircuit generated between adjacent two flaws formed on adjacent two coils. The surge test is generally advantageous when the flaw of coil is in contact with or proximate to the laminate core or when respective flaws of adjacent two coils come very close to each other. However, there is the limit in the surge test to detect the existence of the flaw. For instance, if there is a distance of 1 mm or over between adjacent two flaws, it is very difficult to detect existence of the flaws.

According to the corona discharge test which is the test for detecting partial discharge, it is possible to detect a flaw of coil with very high sensitivity when the flaw is in contact with or proximate to the laminate core. However, the corona discharge test can not be applied to detect existence of a flaw of coil having a distance of 1 mm or over from the laminate core and flaws formed in the coils.

Decompression corona discharge test is the most sensitive testing method among the aforementioned testing methods in detecting a flaw of coil. In this decompression corona discharge test, AC voltage is applied to a test sample in a container with a pressure equal to or less than the atmospheric pressure. A flaw of coil is detected by occurrence of a corona discharge under a desirable condition for generating a discharge in compliance with the Paschen's law. FIG. 7 is an illustration showing a configuration of the decompression corona discharge test. In FIG. 7, a test sample of motor coil 61 is mounted in a decompression tank 62 having insulation bushings 66 and 67. A vacuum pump 65 is connected to the decompression tank 62 through a valve 64. A vacuum gauge 63 for monitoring degree of vacuum is connected to the decompression tank 62. A pressure of the decompression tank 62 is reduced by driving the vacuum pump 65.

An AC voltage supplied by an AC power source 68 is applied to the motor coil 61. A laminate core 61a is connected to a filter 69, and the filter 69 is connected to a corona detector 610. The corona detector 610 detects amount of the corona discharge.

FIG. 8 is a front view showing a part of a laminate core 71 and a motor coil 72. A flaw 73 of coil is formed proximate to the laminate core 71, and a flaw 74 of coil is formed in a position having a distance of about 10 mm from the laminate core 71. Also, a flaw 75 of coil is formed in a position having a distance of about 30 mm from the laminate core 71. When an AC voltage of 300 to 500 V is applied to the motor coil 72 in a predetermined reduced pressure, a corona discharge occurs between the flaw 73 and the laminate core 71. It is therefore easy to detect existence of the flaw 73. However, detection of the flaw 74 is impossible in such condition because the flaw 74 is formed away from the laminate core 71 as compared with the flaw 73. When an AC high voltage of 700 to 1400 V is impressed to the motor coil 72, the corona discharge develops into glow discharge. In this stage, the flaw 74 is detected for the first time. However, since the discharge caused by power-frequency (60 Hz) voltage under the reduced pressure generates a large discharge energy, a periphery of the flaw 74 causes great dielectric breakdown. Such a severe result is far from the non-destructive test. Therefore, this testing method is not suitable to inspect all products during the industrial process of mass-production.

In summary, the conventional testing methods have the following shortcomings:

(a) It is difficult to detect a flaw of coil when the flaw is formed in a position having several millimeter to ten millimeter or over from the laminate core;

(b) If such flaw may be found by detecting discharge, an electric breakdown occurs in a periphery of the flaw of coil, thereby resulting in a destructive test;

(c) It is difficult to carry out 100% non-destructive inspection during the industrial process of mass-production.

OBJECT AND SUMMARY OF THE INVENTION

An object of the present invention is to offer a non-destructive insulation testing method and apparatus for a small-size electric machine which are capable of detecting a flaw of coil even when the flaw is formed in a position having several millimeter to ten millimeter or over from the laminate core through execution of 100% inspection for all products.

In order to achieve the above-mentioned object, a non-destructive insulation testing method of the present invention comprises the steps of:

mounting the electric machine in a container whose inner pressure is kept from 15 to 25 [Torr];

applying a surge voltage to the coil; and detecting whether a glow discharge is generated or not from the coil.

Also, a non-destructive insulation testing apparatus of the present invention comprises:

a container for mounting therein the electric machine, the container having an inner pressure kept from 15 to 25 [Torr];

surge applying means for applying a surge voltage to the coil; and surge detection means for observing a surge voltage waveform appearing between both ends of the coil, the surge detection means including:

means for measuring a first time period which is correlative with a wavelength of the surge voltage waveform in a state that a reference surge voltage is applied to the coil;

means for measuring a second time period which is correlative with a wavelength of the surge voltage waveform in a state that a surge voltage higher than the reference surge voltage is applied to the coil;

means for obtaining a difference between the first time period and the second time period; and means for comparing the difference with a reference value.

According to the method and apparatus of the present invention, a discharge stress is greatly reduced by applying to a coil a surge voltage instead of an AC voltage, and thereby it becomes possible to increase an instantaneous peak voltage applied to the coil. As a result, a sensitivity in detecting a flaw of coil is improved even under the non-destructive test. Also, by employing the reduced pressure of the range from 15 to 25 [Torr], generation of insignificant corona discharge is prohibited, and still it is possible to sensitively detect existence of a flaw of coil having a distance of 10 mm or over from the laminate core. Further, according to the non-destructive insulation testing apparatus of the present invention, an abnormal coil (i.e., having a flaw of coil) can be found by observing variation in wavelength of the surge voltage waveform. Accordingly, it is possible to inspect all the products in the mass-production line.

While the novel features of the invention are set forth particularly in the appended claims, the invention, both as to organization and content, will be better understood and appreciated, along with other objects and features thereof, from the following detailed description taken in conjunction with the drawings.

BRIEF DESCRIPTION OF THE DRAWINGS

FIG. 8 is a front view showing a part of a laminate core and a coil in the motor.

It will be recognized that some or all of the Figures are schematic representations for purposes of illustration and do not necessarily depict the actual relative sizes or locations of the elements shown.

DESCRIPTION OF THE PREFERRED EMBODIMENT

Hereafter, a preferred embodiment will be described with reference to the accompanying drawings.

Figure 1:
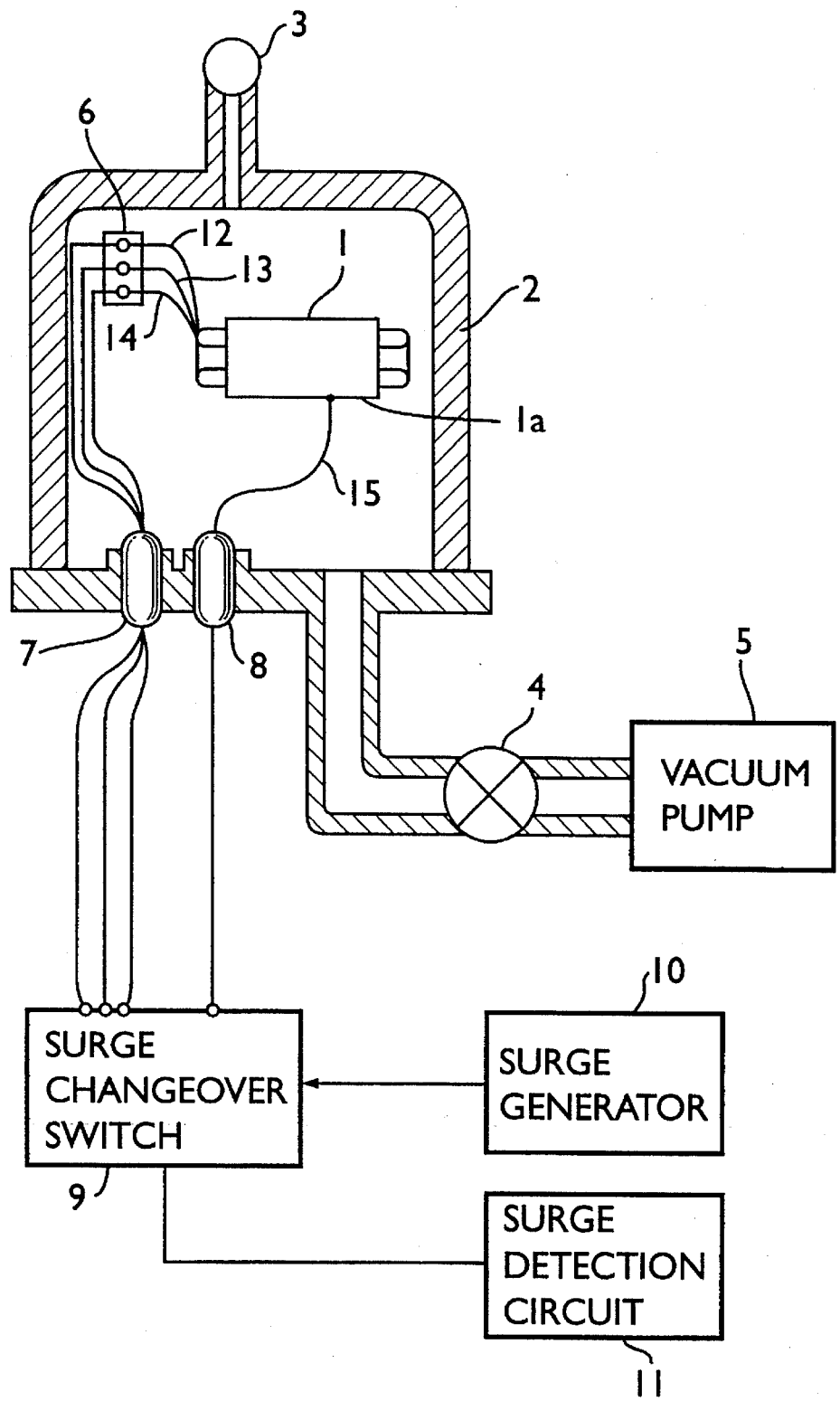
FIG. 1 is a combination drawing of a cross-sectional view and an outline of a block diagram showing an apparatus for a non-destructive insulation testing method of the present invention.

FIG. 1 is a combination drawing of a cross-sectional view and an outline of a block diagram showing an apparatus for embodying a non-destructive insulation testing method of the present invention. In FIG. 1, a motor 1 offered to the test is mounted in a decompression tank 2 at a position sufficiently spaced from the decompression tank 2. Lead wires 12, 13 and 14 for respective coils of the motor 1 are connected to a surge changeover switch 9 via an insulation terminal 6. A laminate core 1a of the motor 1 is connected to the surge changeover switch 9 by way of a wire 15. Bushings 7 and 8 hold the wires 12–14 and 15 and keep insulation thereof from the decompression tank 2. A vacuum pump 5 is connected to the decompression tank 2 through a valve 4. A vacuum gauge 3 for monitoring degree of vacuum is connected to the decompression tank 2. A pressure in the decompression tank 2 is reduced into a predetermined reduced pressure by driving the vacuum pump 5.

Figure 2:
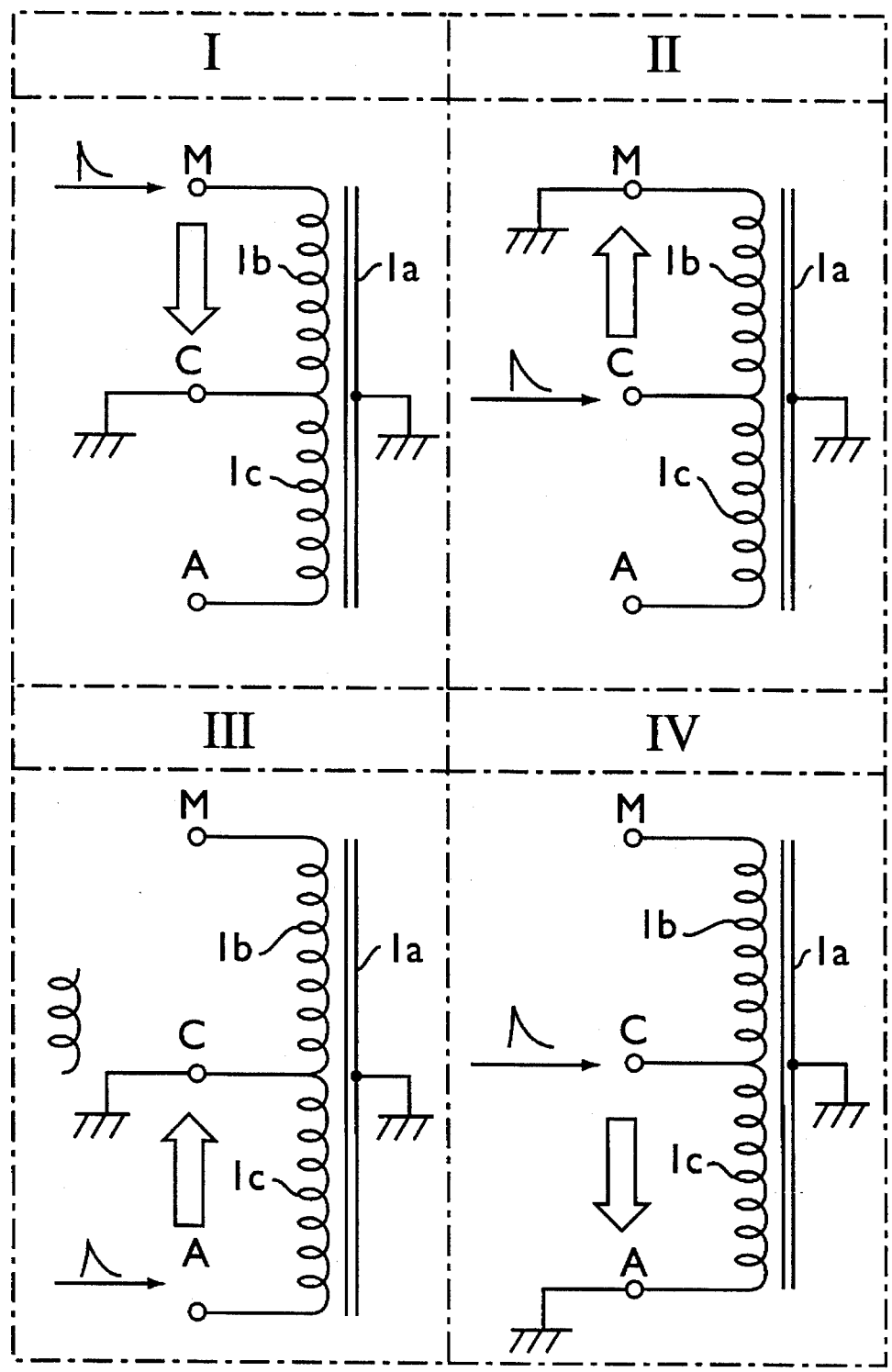
FIG. 2 is a illustration showing four switch patterns in the non-destructive insulation testing method of the present invention.

A surge voltage generated in a surge generator 10 is applied to a coil of the motor 1 through one of the lead wires 12–14. Another of the lead wires 12–14 is grounded, and the other of the lead wires 12–14 is not connected to anything. There are four switch patterns of connection, which is realized by the surge changeover switch 9, as shown in FIG. 2. The surge voltage is evenly applied to the coil in accordance with the switch patterns I, II, III and IV. The surge voltage is thus applied to the coil in all directions, and a surge current flows in all the ways of the coil.

In the switch pattern I, the surge current enters a tap M which is the beginning point of winding of a main coil 1b in the motor 1 (FIG. 1) and flows out from a tap C which is the common connection point of the main coil 1b and an auxiliary coil 1c. A surge stress given by the surge current is applied between adjacent windings of the main coil 1b, and the surge stress is also applied between the main coil 1b and the laminate core 1a. Surge energy becomes extinct at the tap C of the common point.

In the switch pattern II, the surge current flows in the main coil 1b in a direction reverse to the state of the switch pattern I, thus giving even stress in both directions to the main coil 1b.

In the switch pattern III, the surge current enters a tap A which is the beginning point of winding of an auxiliary coil 1c in the motor 1 (FIG. 1) and flows out from the tap C. A surge stress given by the surge current is applied between adjacent windings of the auxiliary coil 1c, and the surge stress is also applied between the auxiliary coil 1c and the laminate core 1a. Surge energy becomes extinct at the tap C.

In the switch pattern IV, the surge current flows in the auxiliary coil 1c in a direction reverse to the state of the switch pattern III, thus giving even stress in both directions to the auxiliary coil 1c.

To detect flaws of coil which are adjacent to each other but have a distance of 1 mm or over between adjacent two flaws, the test is carried out under the condition that grounding of the laminate core 1a is taken off. In this condition, when the surge voltage is applied to the main coil 1b or the auxiliary coil 1c, a layer shortcircuit is caused between the adjacent two flaws. Existence of the flaws resulting in the layer shortcircuit is thus detected completely during the test.

Figure 3:
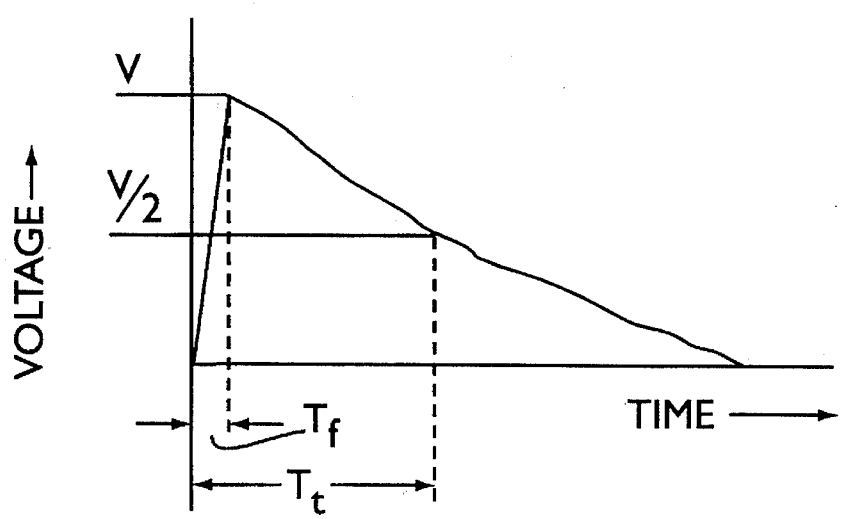
FIG. 3 is a graph showing a waveform of a surge voltage applied to a coil of a motor.

The surge voltage used in the above-mentioned test is a typical impulse as shown in FIG. 3. A duration of wave-front $T_f$ is 1 to 3 μsec, and a duration of wavetail $T_t$ is 40 μsec. According to the surge voltage having such nature, a peak voltage is higher than a buildup voltage supplied from the AC voltage of 60 Hz which is in the form of sine wave, and besides, stress given to the coil is very low.

Figure 4:
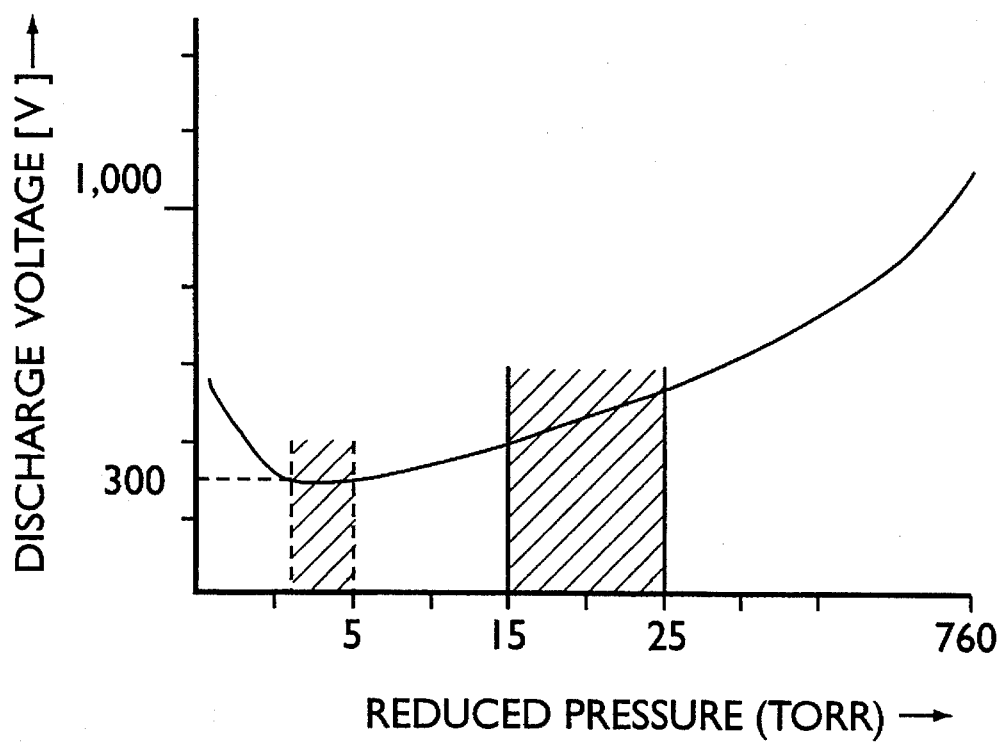
FIG. 4 is a graph showing a relationship between a discharge voltage and a reduced pressure.

Also, in the above-mentioned test, ambient pressure (reduced pressure) of the coils 1b and 1c is controlled to be 15 to 25 [Torr] shown in FIG. 4. Generally, corona discharge under the reduced pressure can be detected with the highest sensitivity in a range of 1 to 5 [Torr]. In this range of 1 to 5 [Torr], generation of corona discharge is made very active. However., large amount of the corona discharge is of useless noise. An S/N (signal to noise) ratio is therefore lowered. As a result, it is difficult to distinguish a partial discharge generated in a flaw of coil to be found out from among a lot of corona discharge. Inventors have found from many experiments that discharge generated in the flaw of coil can be detected with high sensitivity by selecting the reduced pressure of 15 to 25 [Torr] to thereby get into the glow discharge domain. Impression of a peak voltage having a high surge voltage to the coil in the above-mentioned domain brings the below-mentioned multiplier effect:

That is, even when a distance between the flaw of coil and the laminate core 1a (FIG. 2) exceeds approximately 10 mm (i.e., the position of the flaw 74 (FIG. 8)) and comes up to approximately 30 mm (i.e., the position of the flaw 75 (FIG. 8)), the discharge generated in the flaw 75 can be surely detected. Further, by giving a stress of surge flowing-in to the coil, it is possible to detect the discharge generated between the flaws of coil, which are made within a slot of the laminate core 1a, with a high sensitivity as compared with the conventional surge test in the atmospheric pressure.

In the conventional corona discharge test under the reduced pressure, when an AC sine wave voltage is applied to the coil in the domain of glow discharge, discharge stress is too great, thereby resulting in dielectric breakdown in a large area around the flaw of coil. The test thus results in a destructive test. However, by using the surge voltage, stress given by a waveform of the surge is very small. Accordingly, the test can be a non-destructive test.

Figure 5:
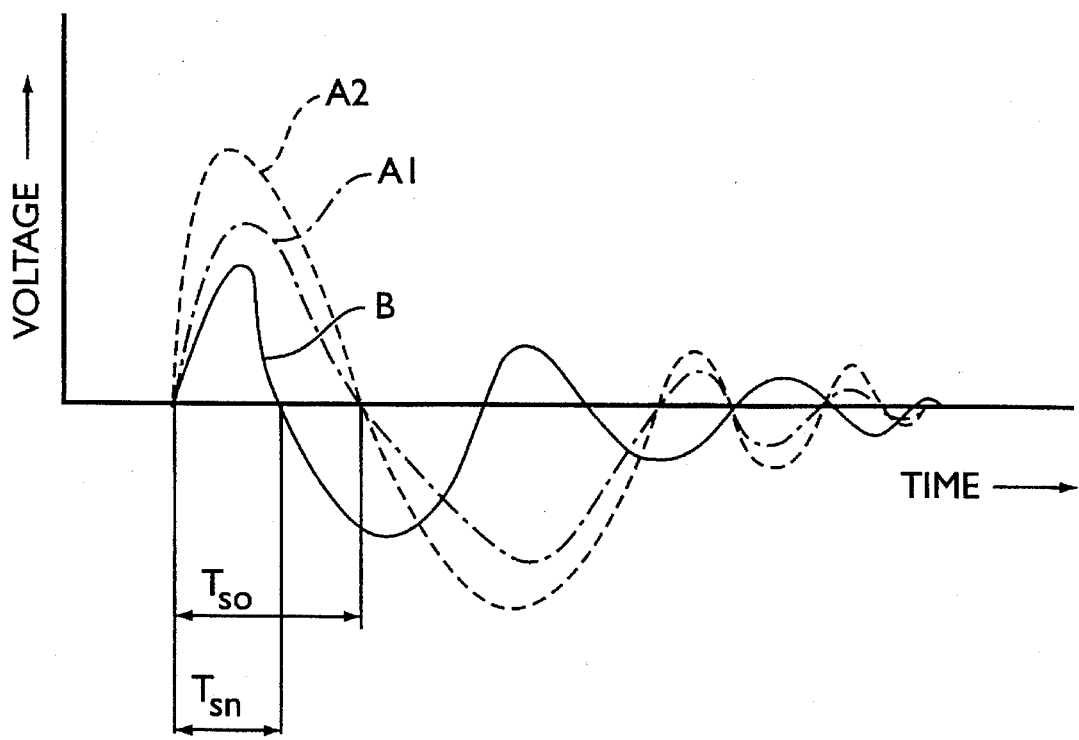
FIG. 5 is a graph showing three waveforms of surge voltage applied to the coil of the motor.

When the surge voltage is applied to the coil, there arises a vibration phenomenon in a waveform of the surge voltage. This is shown in FIG. 5. When the coil has no flaw, discharge is not caused as a matter of course. In this state, a normal waveform "A1" or "A2" as shown in FIG. 5 is observed. The waveform "A1" is obtained when a surge voltage of 1000 V is applied to the coil of the motor 1 having no flaw. The waveform "A2" is obtained when a surge voltage of 1500 V is applied to the coil of the motor 1 having no flaw. However, once a discharge has been caused in case the coil has a flaw, a waveform of the surge voltage gets deformed into a waveform B shown in FIG. 5 because action of the coil changes at the instance of generation of the discharge from an inductance load to a short-circuited load.

As is apparent from the waveforms shown FIG. 5, a time period $T_{s0}$, which corresponds to an initial half wavelength of the waveform A1 or A2, is not changed even when the surge voltage is changed. This is an evidence that the coil of the motor 1 is normal. However, a time period $T_{sn}$, which corresponds to a half wavelength of the abnormal waveform B, is shorter than the time period $T_{sn}$ of the normal waveform A1 or A2. Based on this difference of time (difference of wavelength), all products of the motor can be inspected with a high sensitivity. This sensitivity is very much excellent as compared with a sensitivity presented by the generally-known method utilizing difference of a mean value of the current.

Next, circuitry for detecting existence of a flaw of coil will be described.

Figure 6:
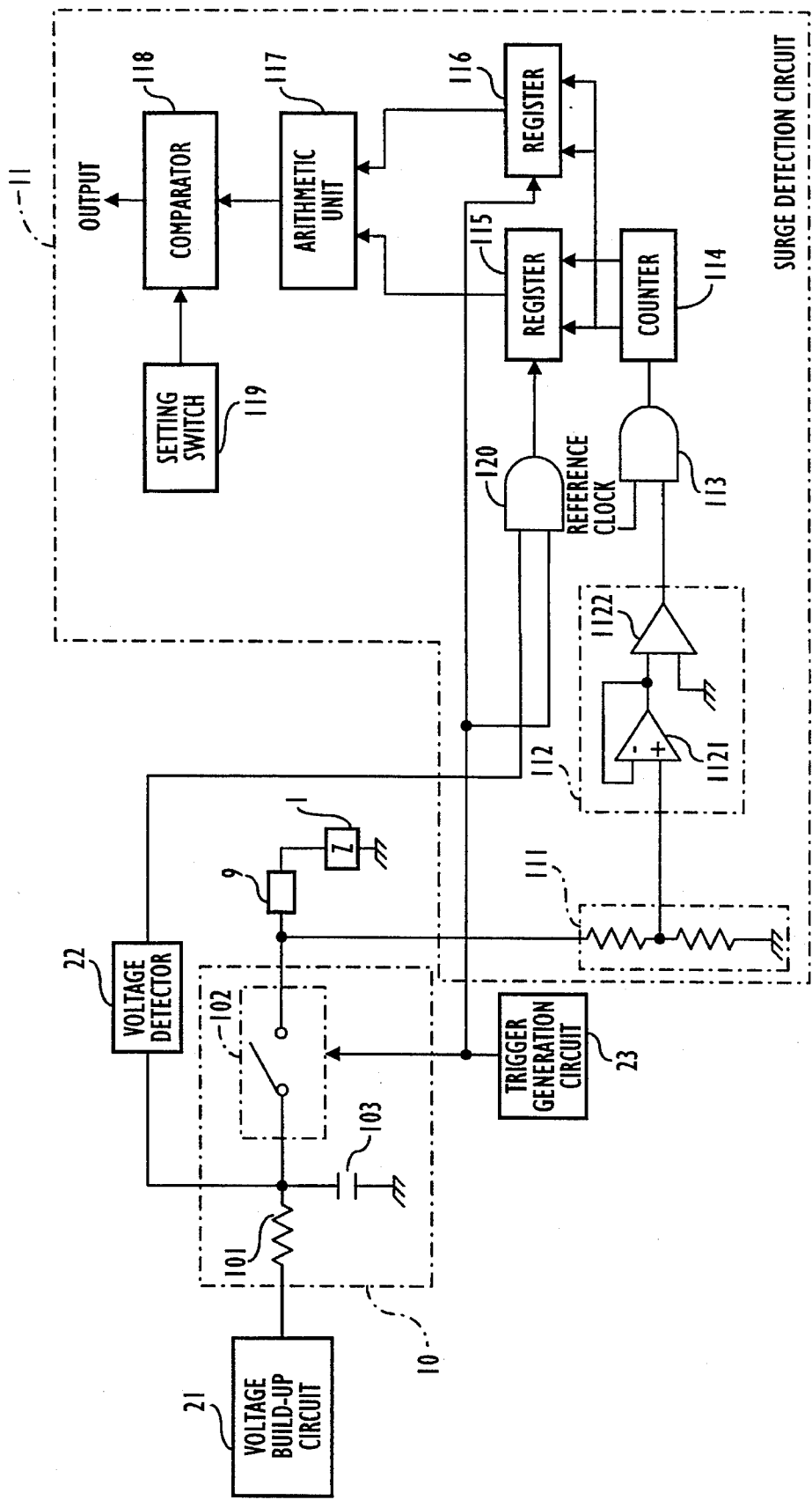
FIG. 6 is a block diagram showing a detailed circuitry of the apparatus shown in FIG. 1.
Figure 7:
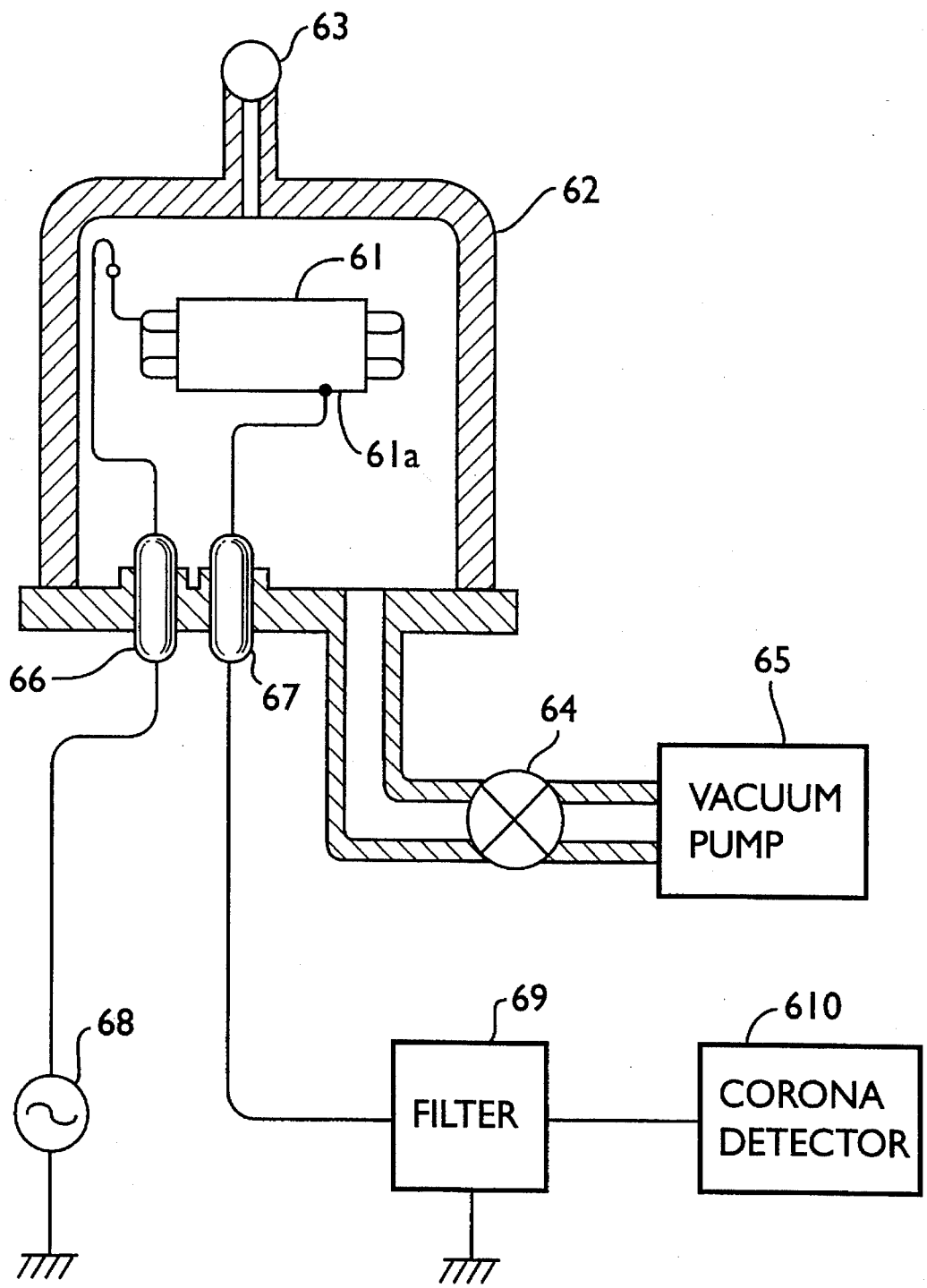
FIG. 7 is a combination drawing of a cross-sectional view and an outline of a block diagram showing the conventional apparatus for a non-destructive insulation testing method.

FIG. 6 is a block diagram showing a detail of circuits of the apparatus shown in FIG. 1. Corresponding parts in FIG. 1 are shown by the same numerals. In FIG. 6, a voltage build-up circuit 21 is connected to the surge generator 10. The surge generator 10 is connected to the motor 1 via the surge changeover switch 9. The surge generator 10 consists of a resistor 101, a semiconductor switch 102 and a capacitor 103. The semiconductor switch 102 turns on or off in response to an output of a trigger generation circuit 23. When the semiconductor switch 102 is opened, the capacitor 103 is charged with electricity by the voltage build-up circuit 21. When the semiconductor switch 102 is closed, electric charge stored in the capacitor 103 flows into the motor 1, thereby applying a surge voltage to the motor 1. The surge detection circuit 11 consists of a voltage divider 111, a zero-crossing point detection circuit 112, an AND-gate 113, a counter 114, a pair of registers 115 and 116, an arithmetic unit 117, a comparator 118, a setting switch 119 and an AND-gate 120. A voltage charged in the capacitor 103 is detected by a voltage detector 22, and a voltage detected by the voltage detector 22 is input to the AND-gate 120. The surge voltage applied to the motor 1 is also applied to the voltage divider 111.

Operation of the above-mentioned surge detection circuit will be described hereafter. First, the voltage build-up circuit 21 supplies the capacitor 103 with electric charge, thereby raising a terminal voltage of the capacitor 103. When the terminal voltage reaches a predetermined value (e.g., 500 V), the voltage detector 22 detects this voltage and issues an output signal to the AND-gate 120. At that time, the trigger generation circuit 23 supplies the semiconductor switch 102 with a trigger signal, and the semiconductor switch 102 is turned on. At this instance, a surge voltage is applied to the motor 1 by the capacitor 103. This surge voltage is divided by the voltage divider 111 into a low voltage enough to be sent to the zero-crossing point detection circuit 112 which consists of an operational amplifier 1121 as a buffer and an operational amplifier 1122 as an comparator. Within a time period before detection of existence of a zero-crossing point, the AND-gate 113 passes a reference clock signal which is input thereto, and the counter 114 counts number of pulse included in the reference clock signal. The reference clock signal is, for example, a pulse signal of 1 MHz frequency. When the first zero-crossing point (i.e., a lapse point of $T_{s0}$ in time range in FIG. 5) comes, the zero-crossing point detection circuit 112 inverts an output thereof, and thereby the AND-gate 113 prohibits passage of the reference clock signal therethrough. Therefore, an input to the counter 114 is shut off, and a counted value of the counter 114 is forwarded to the register 115 which is active by receiving an output signal from the AND-gate 120. Thus, number "$N_0$" of pulse of the reference clock, which has been counted before appearance of the first zero-crossing point, is registered in the register 115 as a reference value of normal. Under such low voltage of 500 V, any discharge never occurs even if the coil of the motor 1 has a flaw. Accordingly, the above-mentioned reference value is reliable irrespective of a state of the coil of the motor 1.

Next, the voltage supplied from the voltage build-up circuit 21 is further raised. Under this condition, number of pulse before appearance of the first zero-crossing point is counted by the counter 114 in the similar way to the above. A counted number "$N_1$" of pulse is registered in the registers 116. In the arithmetic unit 117, the above-mentioned number "$N_0$" is subtracted by the number "$N_1$", and its difference is compared with a predetermined allowance value "dN" in the comparator 118 to which the allowance value is input beforehand from the setting switch 119. When a difference value of $(N_0-N_1)$ is lower than the allowance value dN, the coil of the motor 1 is normal at least under this voltage. When the difference value of $(N_0-N_1)$ is equal to or larger than the allowance value dN, the coil of the motor 1 is abnormal, and the test after this is not needed now. In case the difference value is within the allowance value, the surge voltage applied to the coil of the motor 1 is further raised, and the similar test to the above is carried out. Thus, up to the highest voltage, e.g., 1500 V, the test is repeated. If the difference value is always within the allowance value, the coil of the motor 1 is normal.

As aforementioned, the time period $T_{s0}$ (FIG. 5) is not changed in substance with regard to the normal coil of the motor 1 even when the surge voltage is changed, whereas the time period $T_{sn}$ (FIG. 5) with regard to the abnormal coil of the motor 1 becomes shorter than the time period $T_{s0}$. Therefore, if the motor 1 is abnormal one having a flaw of coil, the above-mentioned difference $(N_0-N_1)$ is made larger than the allowance value. The abnormal motor 1 is thus discovered by the surge detection circuit 11.

Although the present invention has been described in terms of the presently preferred embodiments, it is to be understood that such disclosure is not to be interpreted as limiting. Various alterations and modifications will no doubt become apparent to those skilled in the art to which the present invention pertains, after having read the above disclosure. Accordingly, it is intended that the appended claims be interpreted as covering all alterations and modifications as fall within the true spirit and scope of the invention.

What is claimed is:

1. A non-destructive insulation testing method for a small-size electric machine having a coil, comprising the steps of:

mounting said electric machine in a container whose inner pressure is kept from 15 to 25 [Torr];

applying a surge voltage to said coil; and detecting whether a glow discharge is generated or not from said coil.

2. A non-destructive insulation testing method in accordance with claim 1, wherein said surge voltage is applied to said coil in a first direction which is from a beginning point of winding to an end point of winding in said coil and in a second direction reverse to said first direction.

3. A non-destructive insulation testing apparatus for a small-size electric machine having a coil, comprising:

a container for mounting therein said electric machine, said container having an inner pressure kept from 15 to 25 [Torr];

surge applying means for applying a surge voltage to said coil; and surge detection means for observing a surge voltage waveform appearing between both ends of said coil, said surge detection means including:

means for measuring a first time period which is correlative with a wavelength of said surge voltage waveform in a state that a reference surge voltage is applied to said coil;

means for measuring a second time period which is correlative with a wavelength of said surge voltage waveform in a state that a surge voltage higher than said reference surge voltage is applied to said coil;

means for obtaining a difference between said first time period and said second time period; and means for comparing said difference with a reference value.

* * * * *